July 8, 1969 W. MERGNER 3,454,791

RADIO FREQUENCY SWITCH CIRCUIT WITH HIGH DECIBEL ISOLATION

Filed Jan. 11, 1966

INVENTOR.
WALTER MERGNER

H. H. Losche
ATT'YS.

United States Patent Office 3,454,791

Patented July 8, 1969

3,454,791

RADIO FREQUENCY SWITCH CIRCUIT WITH HIGH DECIBEL ISOLATION

Walter Mergner, Collingswood, N.J., assignor, by mesne assignments, to the United States of America as represented by the Secretary of the Navy Filed Jan. 11, 1966, Ser. No. 520,311

Int. Cl. H03k *17/74*

U.S. Cl. 307—259 3 Claims

ABSTRACT OF THE DISCLOSURE

An improved radio frequency switching circuit having high decibel isolation for minimizing cross interference usually encountered in switching matrices. The circuit is comprised of a plurality of resistances and solid state diodes in which a first pair of series-coupled diodes polarized in one direction is coupled in series with a second pair of series-coupled diodes polarized in the opposite direction, for placing between the terminals to be switched. The common junction of the first and second diode pairs is resistively coupled to a source of polarity-switching, control bias potential, and the common junction of the two diodes comprising the second pair is coupled via a fifth diode to ground potential and via a sixth diode in series with a resistance to the control bias potential.

*Background of the invention*

This invention relates to electronic switches and more particularly to solid state diode switches with high decibel (db) isolation usable in a radio frequency matrix to minimize cross-interference or cross-talk.

In recent years frequency synthesizers using electronic tuning have come into common usage in radio frequency (RF) generators for test apparatus and in radio sets. These synthesizers are of various types: mixer, divide-by-N, etc. Some mixer types have a requirement that any one of a given number of frequencies can be applied as an input to any one of a number of mixers. This implies the use of an RF switching matrix. A typical synthesizer may use ten frequencies; up to five of these frequencies must be routed by means of the switching matrix to five mixers, the particular combination being governed by the final output frequency desired. This requires a 10 x 5 switching matrix containing 50 crosspoint switches, the individual switches being solid-state devices controlled by a single control line per switch. It is known that such solid state switching devices allow signals to leak through when in the nonconductive condition producing an interfrequency cross-talk that is interference and noise to signals passing through adjacent switches. The "on" and "off" attenuation of these switches must be improved to improve signal transmission of desired signals through the matrix.

*Summary of the invention*

In the present invention known solid state switches have been improved to produce a greater attenuation of the "off" condition than has been achieved heretofore. This is accomplished by improving the isolation of the switching diodes by adding diodes in series and by applying back-biasing voltages at two different junctions of the switching diode series. At one of these junctions the back-biasing voltage is remote from a fixed potential, such as ground, and can be maintained so low that high amplitudes of the RF signal voltage in the direction of the back-biasing voltage cannot reach this back-biasing voltage to cause feedthrough for cross-talk. It is therefore a general object of this invention to provide a solid state RF switching circuit with good diode isolation and high decibel attenuation when the RF switch is open to prevent RF signal feedthrough as cross-talk to adjacent circuits.

*Brief description of the drawing*

These and other objects and the attendant advantages, features, and uses will become more apparent to those of ordinary skill in the art when considered along with the accompanying drawing, in which.

*Description of the preferred embodiment*

Figure 1:
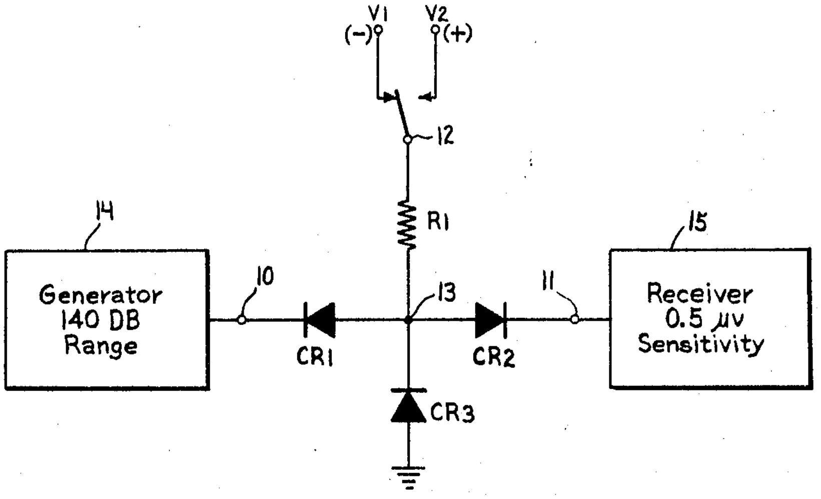
FIGURE 1 is a circuit schematic of a solid state switch having blocks representative of an input and an output to the switch.

Referring more particularly to FIGURE 1 there is shown a pair of crystal diodes or crystal rectifiers CR1 and CR2 in anode back-to-back relation from an input terminal 10 to an output terminal 11. A switch control voltage source is applied to terminal 12 from some remote point to switch a negative voltage shown at terminal V1 or a positive voltage shown at terminal V2 to terminal 12. Terminal 12 is coupled through a resistor R1 to the junction point 13 of the anode back-to-back coupling of the crystal rectifiers CR1 and CR2 and this junction 13 is coupled to the cathode of a crystal rectifier or crystal diode CR3, the anode of which is coupled to a fixed potential, such as ground, with respect to the voltages V1 and V2. In the use of this solid state switch means, terminal 10 is to be coupled to an RF source, herein shown for the purpose of example as being an RF generator 14 having a 140 db range. The output terminal 11 is coupled to a receiver 15, herein shown in block as having a .5 $\mu$ volt sensitivity. As shown in FIGURE 1, terminal 12 is coupled to the negative voltage source V1 which establishes a circuit to ground through the crystal rectifier CR3. This places approximately —.7 volt bias at terminal 13 which back biases the crystal rectifiers CR1 and CR2 placing the switch in its "off" condition. When the positive voltage V2 is applied to terminal 12, CR1 and CR2 will be forward biased and the switch will be "on."

The resistance of a forward biased crystal rectifier or diode in the proximity of the characteristics "knee" is given by the equation $$R=\frac{KT}{eI}=\frac{.025}{I}$$

where

K=Boltzmann's constant
T=absolute temperature in degrees Kelvin
$e$=charge on an electron
I=diode current in amperes If V2 and R1 are chosen so that at least 5 milliamperes flow through CR1 and CR2, the resistance is approximately 5 ohms per crystal rectifier or diode as determined from the above equation. If the input signal is small (less than 0.1 volt RMS) the insertion loss in db of the switch is given by the equation $$\text{db}=20\log\frac{R_g+R_s}{R_L}=20\log\frac{50+5+5}{50}=\log\frac{60}{50}=1.6\text{ db}$$

where $R_g$=generator impedance, $R_s$=the diode conduction impedance, and $R_L$=receiver input impedance, using the impedance of the generator and the receiver as being 50 ohms. For large input signals the bias current is appreciably reduced by the positive swings of the input signal and the insertion loss in db increases. With the switch of FIGURE 1 placed in its nonconductive or "off" condition in which V1 is applied to terminal 12 when generator 14 is applying 5 megacycle RF signals over a 140 db range, for example, the switch attenuation was found to be about 124 db. If a peak negative signal swing exceeds the —.7 volt reverse bias on CR1 and CR2, diode CR1 will become forward biased and cause the switch to pass some of the signal producing cross-interference or cross-talk with other switches of like kind in a matrix.

Figure 2:
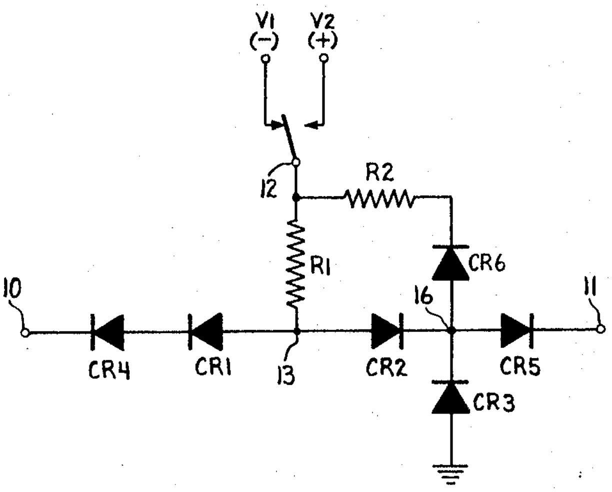
FIGURE 2 is a circuit schematic of greater decibel isolation for radio frequency than the switch of FIGURE 1.

Referring more particularly to FIGURE 2, the switch of FIGURE 1 can be improved in diode isolation by the addition of other diodes or crystal rectifiers in series with CR1 and CR2, such as CR4 and CR5 shown in FIGURE 2, CR4 being oriented in the same direction as CR1 and CR5 being oriented in the same direction as CR2. With these additional diodes CR4 and CR5 in series with CR1 and CR2, it was found that isolation was improved to produce a switch "off" attenuation of about 130 db. In this figure the terminal 13 is coupled directly to terminal 12 through R1 but has no connection to the fixed or ground potential whatsoever. In addition, terminal 12 is coupled through a resistor R2 to the cathode of a crystal rectifier diode CR6, the anode of which is coupled to terminal 16 at the juncture of the cathode of CR2 and the anode of CR5. The crystal rectifier diode CR3 is coupled to terminal 16 in this figure in the same manner that it was coupled to terminal 13 in FIGURE 1. In FIGURE 2, since there is no path to ground from terminal 13 with the negative bias of V1 applied, CR4 and CR1 will be back biased to the full amount of the negative voltage V1. The circuit for the negative voltage V1 is completed through the resistor R2 and CR6 to terminal 16 which terminal is coupled to ground through CR3 placing this terminal 16 at approximately —.7 volt when the "off" voltage or V1 is applied. This provides a double benefit. Not only are the input diodes CR4 and CR1 prevented from being forward biased by large negative input signals, but also the effective capacitance of CR4, CR1, and CR2 is reduced. Where the "off" voltage of V1 is —6 volts, for example, the capacitance of CR4, CR1, and CR2 is 1 picofarad. The capacitance of CR5 is 1.5 picofarad. With a 5 megacycle RF signal applied to terminal 10 over a 140 db range, the attenuation of such a signal in the "off" condition of the switch, where V1 is coupled to 12 as shown in FIGURE 2, will produce about a 140 db attenuation which is large enough to allow very little frequency interference or cross-talk through the switch. Where a plurality of such switches, as shown in FIGURE 2, are placed in a matrix, the "off" switches will be substantially isolated from all other switches minimizing any cross-talk from adjacent switches because each switch substantially isolates the input diodes CR4 and CR1 from the output diodes CR2 and CR5.

While many modifications and changes may be made in the constructional details and features of this invention to provide equivalent switches, I desire to be limited in the spirit of my invention only by the scope of the appended claims.

I claim:

1. A radio frequency switching circuit with high decibel isolation comprising:

an electronic switch of solid state voltage bias responsive diode elements in series from an input to an output thereof; and a bias control circuit of switched positive and negative voltage sources coupled between two of said bias responsive elements to control said bias responsive elements for conduction from said input to said output and for back biasing said bias responsive elements to interrupt conduction from said input to said output whereby isolation is provided by said solid state elements and wherein said bias control circuit includes first and second branch circuits having a resistor in the first branch circuit establishing said coupling between two of said bias responsive elements and having a resistor and two diodes in series in the second branch circuit to a fixed potential with respect to said positive and negative voltage sources with the juncture of said two diodes coupling said output whereby said first branch circuit establishes forward and reverse biases on said bias responsive diode elements at said switched positive and negative voltages and said second branch circuit completes said bias control circuit for each reverse biased condition of said bias responsive diode elements.

2. A radio frequency switching circuit as set forth in claim 1 wherein said solid state voltage bias responsive diode elements in series from said input to said output consist of four, the first two from the input being oriented in the high resistance direction for positive voltage signals and the second two from the input being oriented in the low resistance direction for positive voltage signals to the output, said first branch control circuit being coupled at the juncture of said first two and said second two of said diodes, and said second control branch circuit being coupled at the juncture of said second two diodes.

3. A radio frequency switching circuit as set forth in claim 2 wherein said second branch circuit has said two diodes oriented with high forward resistance from said switched positive and negative voltage sources to said fixed potential and said coupling to said output at the juncture of said two bias responsive diode elements is at the juncture of said two diodes in said second branch control circuit whereby high negative radio frequency signals on said input when said control circuit back biases said bias responsive diodes will be insufficient to overcome said back bias.

References Cited

UNITED STATES PATENTS

| | | | |
|---|---|---|---|
| Re. 25,867 | 9/1965 | Richards | 307—259 X |
| 2,535,303 | 12/1950 | Lewis. | |
| 2,618,753 | 11/1952 | Van Mierlo | 307—259 X |
| 2,782,307 | 2/1957 | Von Sivers et al. | |
| 3,143,664 | 8/1964 | Lourie et al. | 307—259 X |
| 3,146,357 | 8/1964 | Spallone | 307—259 X |

DONALD D. FORRER, *Primary Examiner.*

U.S. Cl. X.R.

328—101